[US010224507B2](#)

United States Patent
Chen et al.

(10) Patent No.: US 10,224,507 B2
(45) Date of Patent: Mar. 5, 2019

(54) FLUORINE-CONTAINING POLYMERIZED HMDSO APPLICATIONS FOR OLED THIN FILM ENCAPSULATION

(71) Applicant: Applied Materials, Inc., Santa Clara, CA (US)

(72) Inventors: Jrjyan Jerry Chen, Campbell, CA (US); Soo Young Choi, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 143 days.

(21) Appl. No.: 15/277,353

(22) Filed: Sep. 27, 2016

(65) Prior Publication Data

US 2017/0018738 A1    Jan. 19, 2017

Related U.S. Application Data

(62) Division of application No. 14/339,705, filed on Jul. 24, 2014, now Pat. No. 9,502,686.

(60) Provisional application No. 62/020,955, filed on Jul. 3, 2014.

(51) Int. Cl.
| | | |
|---|---|---|
| *H01L 21/00* | (2006.01) | |
| *H01L 21/02* | (2006.01) | |
| *H01L 21/312* | (2006.01) | |
| *H01L 35/24* | (2006.01) | |
| *H01L 51/52* | (2006.01) | |
| *H01L 51/56* | (2006.01) | |

(52) U.S. Cl.
CPC .......... *H01L 51/5256* (2013.01); *H01L 51/56* (2013.01); *H01L 2251/5346* (2013.01); *H01L 2251/558* (2013.01)

(58) Field of Classification Search
CPC ............ H01L 51/5253; H01L 51/5256; H01L 2924/0002; H01L 51/5237
USPC ......................................................... 257/211
See application file for complete search history.

(56) References Cited

U.S. PATENT DOCUMENTS

| | | |
|---|---|---|
| 6,150,187 A | 11/2000 | Zyung et al. |
| 6,465,953 B1 | 10/2002 | Duggal |
| 2004/0152390 A1 | 8/2004 | Chung et al. |

(Continued)

FOREIGN PATENT DOCUMENTS

KR    10-1560234 B1    10/2015

OTHER PUBLICATIONS

Han-Ki Kim, Sang-Woo Kim, Do-Geun Kim, Jae-Wook Kang, Myung Soo Kim, and Woon Jo Cho, Thin Solid Films 515 (2007)4758.

(Continued)

*Primary Examiner* — Joseph C Nicely
*Assistant Examiner* — Thai T Vuong
(74) *Attorney, Agent, or Firm* — Patterson + Sheridan LLP

(57) ABSTRACT

Methods for forming an OLED device are described. An encapsulation structure having organic buffer layer and an interface layer disposed on the organic buffer layer sandwiched between barrier layers is deposited over an OLED structure. In one example, an OLED device includes a first barrier layer disposed on a region of a substrate having an OLED structure disposed thereon, a fluorinated buffer layer including a polymer material containing fluorine disposed on the first barrier layer, an interface layer including the polymer material on the fluorinated buffer layer, and a second barrier layer disposed on the interface layer.

18 Claims, 3 Drawing Sheets

(56) References Cited

U.S. PATENT DOCUMENTS

| | | |
|---|---|---|
| 2004/0229051 A1 | 11/2004 | Schaepkens et al. |
| 2005/0106875 A1 | 5/2005 | Kubota et al. |
| 2005/0223986 A1 | 10/2005 | Choi et al. |
| 2006/0115590 A1 | 6/2006 | Suzuki et al. |
| 2007/0077761 A1 | 4/2007 | Lehr et al. |
| 2007/0290201 A1 | 12/2007 | Hoffmann et al. |
| 2009/0218317 A1 | 9/2009 | Belen et al. |
| 2010/0305291 A1* | 12/2010 | Timmons ............ C08F 2/004 526/317.1 |
| 2011/0140163 A1 | 6/2011 | Oh et al. |
| 2011/0291077 A1 | 12/2011 | Fong et al. |
| 2012/0173692 A1 | 7/2012 | Lakes et al. |
| 2012/0174550 A1 | 7/2012 | Pruitt et al. |
| 2012/0199872 A1 | 8/2012 | Chen et al. |
| 2012/0208306 A1 | 8/2012 | Haas et al. |
| 2012/0258295 A1 | 10/2012 | Leyder et al. |
| 2013/0334511 A1 | 12/2013 | Savas et al. |
| 2014/0024180 A1 | 1/2014 | Choi et al. |
| 2014/0065739 A1 | 3/2014 | Chen et al. |

OTHER PUBLICATIONS

Anna Maria Coclite and Karen K. Gleason, J. Appl. Phys. 111(2012)073516.
Jian-Shian Lin, Ming-Hua Chung, Chen-Ming Chen, Fuh-Shyang Juang, and Lung-Chang Liu, J. Phys. Org. Chem. 24 (2011)193.
H.-J. You, Rev. Sci. Instrum. 84(2013)073513.
Kazufumi Azuma, Satoko Ueno, and Yoshiyuki, Thin Solid Films 580(2015)116.
FJH Van Assche, RT Vangheluwe, JWC Maes, WS Mischke, MD Bijker, and FC Dings, SID Dig 2004; 35:695-7.
H Lifka, HA van Esch, and JJWM Rosink, SID Dig 2004; 35:1384-7.
JJWM Rosink, H Lifka, GH Rietjens, and A Pierik, SID Dig 2005; 36:1272-5.
Renzheng Sang, Hao Zhang, Li Long, , Zikai Hua, Jianling Yu,, Bin Wei, , Xingyang Wu, Tao Feng, and, Jianhua zhang, International Conference on Electronic Packaging Technology & High Density Packaging, p. 1175 (2011).
E.N. Ermakova, S.V. Sysoev, L.D. Nikulina, I.P. Tsyrendorzhieva, V.I. Rakhlin, and M.L. Kosinova, Thermochimica Acta (2015) in press.
A Yoshida, S Fujimura, T Miyake, T Yoshizawa, H Ochi, and A Sugimoto, SID Dig 2003; 34:856-9.
H. Yasuda, "Plasma Polymerization", Academic Press Inc., Orlando (1985).
N. De Geyter, R. Morent, S. Van Vlierberghe, P. Dubruel, C. Leys, and E. Schacht, Surface Engineering vol. 27, No. 8 (2011)627.
Fulvia Villani, Paolo Vacca, Giuseppe Nenna, Olga Valentino, Gianbattista Burrasca, Tommaso Fasolino, Carla Minarini and Dario della Sala, J. Phys. Chem. C, 2009, 113 (30), pp. 13398-13402.
Marcel Hemerik, Rob Van Erven, Rik Vangheluwe, james Yang, Tom Van Rijswujk, Rogier Winters, and Bas Van Rens, SID Symp. Digest Vlo. 37, Issue 1 (2006)1571.
D. Hegemann, U. Vohrer, C. Oehr, and R. Riedel, Surface and Coating Technology 116-119(1999)1033-1036.
Mirjam Theelen, David Habets, Lutz Staemmler, Hans Winands, and Pieter Bolt, Surface and Coating Technology 211 (2012)9-13.
Jrjyan Jerry Chen, "Thin Film Encapsulation by PECVD", Applied Materials.
Prashant Mandlik, Jonathan Gartside, Lin Han, I-Chun Cheng, Sigurd Wagner, Jeff A. Silvernail, Rui-Qing Ma, Michael Hack, and Julie J. Brown, Appl. Phys. Lett. 92(2008)103309.
Yun-Shiuan Li, Chih-Hung Tsai, Shao-Hsuan Kao, I-Wen Wu, Jian-Zhang Chen, Chih-I Wu, Ching-Fuh Lin, and I-Chun Cheng, Physics D: Applied Physics vol. 46, No. 43, 435502(2013).
Tae Won Kim, Min Yan, Ahmet Gun Erlat, paul A. McConnelee, Mathew Pellow, John Deluca, Thomas P. Feist, Anil R. Duggal, and Marc Schaepkens, J. Vac. Sci. Technol. A 23(2005)971.
A. P. Ghosh, L. J. Gerenser, C. M. Jaman, and J. E. Fomalik, Appl. Phys. Lett. 86(2005)223503.
Seung-Woo Seo, Heeyeop Chae, Sang Joon Seo, Ho Kyoon Chung, and Sung Min Cho, Appl. Phys. Lett. 102(2013) 161908.
P. F. Carcia, R. S. McLean, M. D. Groner, A. A. Dameron, and S. M. George, J. Appl. Phys. 106(2009)023533.
F. L. Wang, M. K. Fung, S. L. Tao, S. L. Lai, W. M. Tsang, K. H. Kong, W. M. Choy, C. S. Lee, and T. S. Lee, J. Appl. Phys. 104(2008)014509.

* cited by examiner

FLUORINE-CONTAINING POLYMERIZED HMDSO APPLICATIONS FOR OLED THIN FILM ENCAPSULATION

CROSS-REFERENCE TO RELATED APPLICATIONS

This application is a divisional of U.S. patent application Ser. No. 14/339,705, filed Jul. 24, 2014, which claims benefit of U.S. Provisional Application Ser. No. 62/020,955 filed Jul. 3, 2014, both of which are incorporated by reference in their entireties.

BACKGROUND

Field

Embodiments of the disclosure generally relate to a method and apparatus for encapsulating an organic light emitting diode (OLED).

Description of the Related Art

An OLED is used in the manufacture of television screens, computer monitors, mobile phones, other hand-held devices, etc. for displaying information. OLED displays have gained significant interest recently in display applications due to their faster response time, larger viewing angles, higher contrast, lighter weight, low power and amenability to flexible substrates such as compared to liquid crystal displays (LCD).

OLED structures may have a limited lifetime, characterized by a decrease in electroluminescence efficiency and an increase in drive voltage. A main reason for the degradation of OLED structures is the formation of non-emissive dark spots due to moisture or oxygen ingress. For this reason, OLED structures are typically encapsulated by a buffer layer sandwiched between barrier layers. The buffer layer is utilized to fill any voids or defects in the first barrier layer such that the second barrier layer has a substantially uniform surface for deposition. However, some of the materials utilized to form the buffer layer undesirably generate bubbles at the interface where the barrier layer is in contact with the second barrier layer. Bubbles formed at the interface may adversely be detriment to the film stack adhesion, thus eventfully leading to poor device performance and device failure.

Therefore, an improved method and apparatus for encapsulating an OLED structure is needed.

SUMMARY

Methods for forming an OLED device are described. An encapsulation structure including an interface layer formed on a buffer layer sandwiched between barrier layers for an OLED structure are provided. The buffer layer is formed with a fluorine-containing plasma with the interface layer disposed thereon to eliminate bubble formation while forming the barrier layer and the interface layer. The second barrier layer is then deposited over interface layer. Additionally, to ensure good adhesion, a buffer adhesion layer may be optionally formed between the buffer layer and the first barrier layer.

In one embodiment, a method for forming an encapsulating structure on an OLED device includes depositing a first barrier layer on a region of a substrate having an OLED structure disposed thereon, depositing a buffer layer with a fluorine-containing plasma formed from a first gas mixture containing a polymer gas precursor and a fluorine containing gas on the first barrier layer, depositing an interface layer on the buffer layer with a second gas mixture containing the polymer gas precursor, and depositing a second barrier layer on the interface layer.

In another embodiment, In one example, an OLED device includes a first barrier layer disposed on a region of a substrate having an OLED structure disposed thereon, a fluorinated buffer layer including a polymer material containing fluorine disposed on the first barrier layer, an interface layer including the polymer material on the fluorinated buffer layer, and a second barrier layer disposed on the interface layer.

In yet another embodiment, a method for forming an encapsulating structure on an OLED device includes supplying a first gas mixture including a HMDSO gas and a fluorine containing gas in a processing chamber to form a buffer layer on a region of a substrate having an OLED structure disposed thereon, and supplying a second gas mixture including the HMDSO gas without the fluorine containing gas or with a diminished flow rate of the fluorine containing gas in the same processing chamber to form an interface layer on the buffer layer.

In yet another example, an OLED device includes a first barrier layer disposed on a region of a substrate having an OLED structure disposed thereon, a fluorinated plasma-polymerized hexamethyldisiloxane (pp-HMDSO:F) material formed on the barrier layer, and a plasma-polymerized hexamethyldisiloxane (pp-HMDSO) material formed on the fluorinated plasma-polymerized hexamethyldisiloxane (pp-HMDSO:F) material.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Methods for forming an OLED device are described. An encapsulation structure having buffer layer and an interface layer disposed on the buffer layer sandwiched between barrier layers is deposited over an OLED structure. The buffer layer is formed with a fluorine-containing plasma while the interface layer as formed thereon eliminates bubble formation which is likely generated during the buffer layer deposition from the fluorine-containing plasma. The second barrier layer is then deposited over the interface layer. In one example, the interface layer may be formed in the same chamber where the buffer layer is formed. The interface layer may be configured to be a fluorine concentration gradient polymer layer or a fluorine free polymer layer that has diminished fluorine concentration gradually fading away (e.g., reduced) or without fluorine concentration formed in the interface layer.

Figure 1:
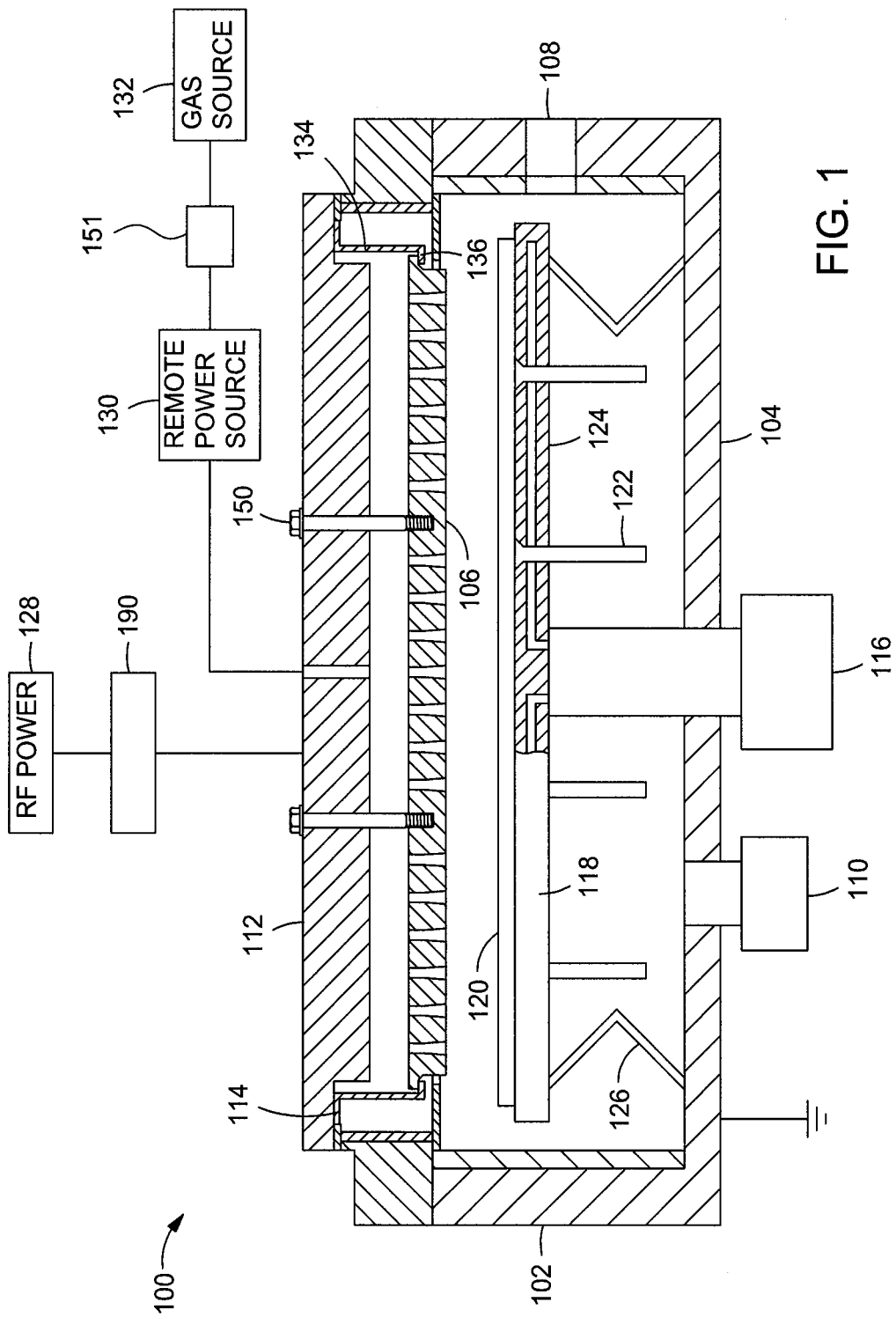
FIG. 1 is a schematic, cross-sectional view of a PECVD apparatus chamber that may be used to perform the methods described herein.

FIG. 1 is a schematic, cross sectional view of a plasma enhanced chemical vapor deposition (PECVD) apparatus that may be used to perform the operations described herein. The apparatus includes a processing chamber 100 in which one or more films may be deposited onto a substrate 120. The processing chamber 100 generally includes walls 102, a bottom 104 and a showerhead 106 which define a process volume. A substrate support 118 is disposed within the process volume. The process volume is accessed through a slit valve opening 108 such that the substrate 120 may be transferred in and out of the processing chamber 100. The substrate support 118 is coupled to an actuator 116 to raise and lower the substrate support 118. Lift pins 122 are moveably disposed through the substrate support 118 to move the substrate 120 to and from the substrate receiving surface. The substrate support 118 also includes heating and/or cooling elements 124 to maintain the substrate support 118 at a desired temperature. The substrate support 118 also includes RF return straps 126 to provide an RF return path at the periphery of the substrate support 118.

The showerhead 106 is coupled to a backing plate 112 by a fastening mechanism 150. The showerhead 106 is coupled to the backing plate 112 by one or more fastening mechanisms 150 to help prevent sag and/or control the straightness/curvature of the showerhead 106.

A gas source 132 is coupled to the backing plate 112 to provide gas through gas passages in the showerhead 106 to a processing area between the showerhead 106 and the substrate 120. A vapor delivery system (VDS) 151 may be utilized to supply gas to the processing chamber 100 with or without going to a remote plasma power source 130. As a liquid delivery system utilized conventionally may sometimes supply a liquid precursor to the processing chamber 100 without sufficient evaporation, such incomplete evaporation of the liquid precursor may generate undesired bubbles when forming a film layer on the substrate 120. As such, by utilizing a vapor delivery system 151 when supplying a polymer/liquid based precursor to the processing chamber 100, the polymer/liquid based precursor may be more thoroughly evaporated prior to entering into the processing chamber 100, thus greater reducing the likelihood of bubble generation during a deposition process.

A vacuum pump 110 is coupled to the processing chamber 100 to maintain the process volume at a desired pressure. An RF source 128 is coupled through a match network 190 to the backing plate 112 and/or to the showerhead 106 to provide an RF current to the showerhead 106. The RF current creates an electric field between the showerhead 106 and the substrate support 118 so that a plasma may be generated from the gases between the showerhead 106 and the substrate support 118.

A remote plasma source 130, such as an inductively coupled remote plasma source 130, is coupled between the gas source 132 (through the vapor delivery system 151) and the backing plate 112. Between processing substrates, a cleaning gas may be provided to the remote plasma source 130 so that a remote plasma is generated. The radicals from the remote plasma may be provided to processing chamber 100 to clean chamber components. The cleaning gas may be further excited by the RF source 128 provided to the showerhead 106.

The showerhead 106 is additionally coupled to the backing plate 112 by showerhead suspension 134. In one embodiment, the showerhead suspension 134 is a flexible metal skirt. The showerhead suspension 134 may have a lip 136 upon which the showerhead 106 may rest. The backing plate 112 may rest on an upper surface of a ledge 114 coupled with the chamber walls 102 to seal the processing chamber 100.

Figure 2:
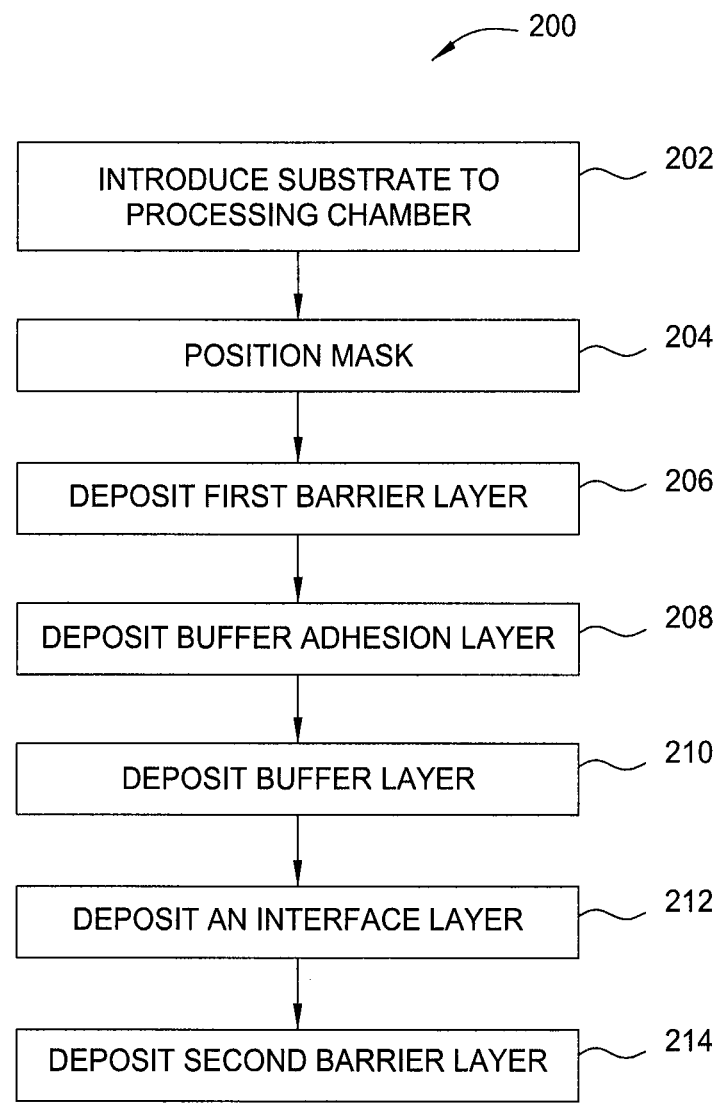
FIG. 2 is a flow diagram of a method for forming an OLED device in accordance with one embodiment of the present disclosure.
Figure 3A:
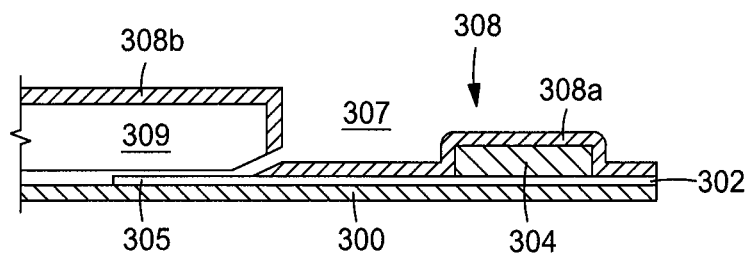
FIGS. 3A-3E illustrate schematic cross-sectional views of the OLED device during different stages of the method of FIG. 2.

FIG. 2 is a flow diagram of a method 200 for forming an encapsulating structure over an OLED device according to various embodiments of the disclosure. FIGS. 3A-3E illustrate schematic cross-sectional views of an OLED device during different stages of the method 200 of FIG. 2. The method 200 starts at process 202 by introducing a substrate 300 having a preformed OLED structure 304 disposed thereon into a processing chamber such as processing chamber 100. The substrate 300 may have a contact layer 302 disposed thereon, with the OLED structure 304 disposed on the contact layer 302, as shown in FIG. 3A.

At process 204, a mask 309 is aligned over the substrate 300 such that the OLED structure 304 is exposed through an opening 307 unprotected by the mask 309, as shown in FIG. 3A. The mask 309 is positioned such that a portion 305 of the contact layer 302 adjacent the OLED structure 304 is covered by the mask 309 so that any subsequently deposited material does not deposit on the portion 305. The portion 305 of the contact layer 302 is the electrical contact for the OLED device, thus no material may be deposited thereon. The mask 309 may be made from a metal material, such as INVAR®.

At process 206, a first barrier layer 308 is deposited on the substrate 300, as shown in FIG. 3A. The first barrier layer 308 has a first portion 308a and a second portion 308b and a thickness of between about 5000 Angstroms and about 10000 Angstroms. The first portion 308a of the first barrier layer 308 is deposited through the opening 307 onto a region of the substrate 300 exposed by the mask 309, which includes the OLED structure 304 and a portion of the contact layer 302. The second portion 308b of the first barrier layer 308 is deposited on the mask 309 covering a second region of the substrate 300, which includes the portion 305 of the contact layer 302. The first barrier layer 308 is a dielectric layer, such as silicon nitride (SiN), silicon oxynitride (SiON), silicon dioxide (SiO$_2$), aluminum oxide (Al$_2$O$_3$), aluminum nitride (AlN), or other suitable dielectric layers. In one embodiment, the first barrier layer 308 comprises silicon nitride. The first barrier layer 308 may be deposited by a suitable deposition technique, such as chemical vapor deposition (CVD), PECVD, physical vapor deposition (PVD), spin-coating, or other suitable technique. The first barrier layer 308 may be deposited by introducing a silicon containing precursor, such as silane, together with one or more nitrogen containing precursors, such as N$_2$ and NH$_3$, together with hydrogen.

Figure 3B:
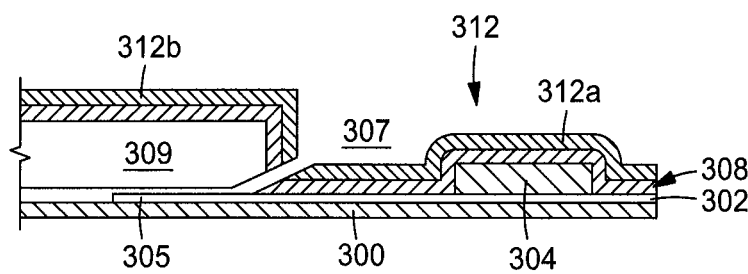

At process 208, after the first barrier layer 308 is formed on the substrate 300, an optional buffer adhesion layer 312 is then formed on the first barrier layer 308 on the substrate 300, as shown in FIG. 3B, to promote adhesion for the first barrier layer 308 to a subsequent layer (e.g., a buffer layer 314, which will be discussed later with reference to FIG. 3C) disposed thereon. A first portion 312a of the buffer adhesion layer 312 is deposited on the substrate 300 through the opening 307 of the mask 309 on the region of the substrate 300 exposed by the mask 309, covering the first portion 308a of first barrier layer 308. A second portion 312b of the buffer adhesion layer 312 is deposited on the second portion 308b of the first barrier layer 308 disposed on the mask 309, which covers the portion 305 of the contact layer 302. The buffer adhesion layer 312 is deposited on the first barrier layer 308 within the same chamber that the first barrier layer 308 is formed. The buffer adhesion layer may 312 comprise a dielectric material such as silicon oxynitride or silicon nitride.

Figure 3C:
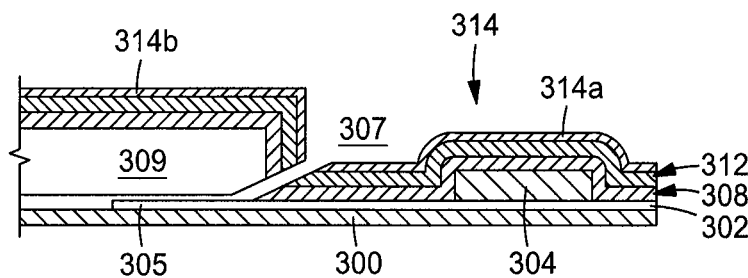

At process 210, after depositing the buffer adhesion layer 312, a buffer layer 314 is deposited on the buffer adhesion layer 312, as shown in FIG. 3C. The buffer layer 314 may be fluorinated plasma-polymerized hexamethyldisiloxane (pp-HMDSO:F) deposited in a PECVD chamber, such as the processing chamber 100 depicted in FIG. 1. The buffer layer 314 has a thickness of between about 0.5 µm to about 5 µm. Deposition of the pp-HMDSO:F layer is achieved by flowing one or more fluorine-containing gases and a polymer gas, such as a HMDSO gas, along with either $O_2$ or $N_2O$ gas in a first deposition gas mixture. The fluorine-containing gas may be nitrogen fluoride ($NF_3$), silicon fluoride ($SiF_4$), fluorine gas ($F_2$), carbon tetrafluoride ($CF_4$), or any combinations thereof. Fluorine doped plasma polymerized HMDSO layer has superior particle coverage performance and surface planarization effect. The buffer layer 314 has a fluorine content of less than 10 atomic percent.

During the deposition of the buffer layer 314 of a pp-HMDSO:F layer, the ratio of the flow rates of the fluorine-containing gas and the HMDSO gas supplied in the first deposition gas mixture may be between about 0.25 and about 1.5. If there is too much fluorine, the carbon in the HMDSO may be taken out. In one embodiment, the PECVD of the pp-HMDSO:F is performed under the following conditions. The $SiF_4$ has a flow rate of 125 standard cubic centimeters per minute (sccm) and HMDSO has a flow rate of 300 sccm. In other words, the ratio of $SiF_4$ to HMDSO is between about 0.40 to about 0.45. The RE source plasma is generated at between about 0.25 Watts/cm$^2$ and about 0.5 Watts/cm$^2$, such as about 700 Watts, and the chamber pressure is about between about 1000 mTorr and about 2000 mTorr, such as 1800 mTorr. The PECVD is deposited at about 80 degrees Celsius and the distance between the substrate 300 and the showerhead 106 is about 650 mil.

In one specific example, the deposition process for forming the buffer layer 314 is performed by flowing the first deposition gas mixture including the silicon-carbon precursor, a polymer gas such as the HMDSO gas, at a flow rate per substrate surface area of between about 0.001375 sccm/mm$^2$ and about 0.0016 sccm/mm$^2$, flowing the inert gas at between about 0.00095 sccm/mm$^2$ and about 0.0011 sccm/mm$^2$, and flowing the fluorine precursor at a flow rate per substrate surface area of between about 0.0007 sccm/mm$^2$ and about 0.000825 sccm/mm$^2$. The oxygen containing precursor flow rate per substrate surface area may be controlled at a flow rate between 0.001125 sccm/mm$^2$ and about 0.001275 sccm/mm$^2$.

Figure 3D:
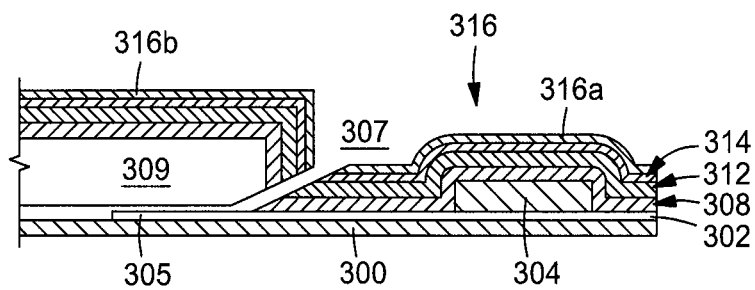

At process 212, after the buffer layer 314 is formed, an interface layer 316 is then formed on the buffer layer 314, as shown in FIG. 3D. Similarly, the interface layer 316 has a first portion 316a formed on the first region of the substrate 300 and a second portion 316b formed on the second region of the substrate 302.

It is believed that when depositing the buffer layer 314 at process 210, the HMDSO is initially a liquid precursor that is generally vaporized prior to entering into the processing chamber 100. However, in some examples, insufficient evaporation of the liquid precursor may result in bubbles on the surface of the resultant buffer layer 314, thus creating interface defects. It is found that these bubbles are unfluorinated HMDSO droplets which may be caused by insufficient evaporation of the HMDSO or undesired nucleated HMDSO vapor droplets. These bubbles may lead to delamination on the surface of the buffer layer 314 and eventually result in device failure. To prevent formation of the undesired bubbles, the interface layer 316 may be formed on the buffer layer 314 to eliminate the likelihood of forming bubbles on the surface of the buffer layer 314.

In one example, the interface layer 316 may be formed in the same chamber wherein the buffer layer 314 is formed but without fluorine containing gas supplied in the first deposition gas mixture. It is believed that the substantially fluorine-eliminated or fluorine free interface layer 316 may assist providing a more well-reacted pp-HMDSO film bonding structure at the interface on the buffer layer 314, so as to eliminate formation of the premature nucleation HMDSO vapor droplets, so that the likelihood of forming bubbles on the surface of the buffer layer 314 may be eliminated.

When forming the fluorine-eliminated or fluorine free HMDSO layer for the interface layer 316, the fluorine containing gas supplied in the first deposition gas mixture may be eliminated and instead supplying a second gas mixture substantially without fluorine containing gas. The process 210 and process 212 for forming the buffer layer 314 and the interface layer 316 may be continuously formed in the same chamber without breaking vacuum. After the first gas mixture is supplied in the processing chamber 100 to form the buffer layer 314, the second gas mixture is then continuously supplied in the same processing chamber 100 to form the interface layer 316. In other words, the process including forming the buffer layer 314 and the interface layer 316 may be a two step depositing process for a first step supplying the first gas mixture with fluorine containing gas and a second stop supplying the second gas mixture without fluorine containing gas. In some examples, the flow rate of HMDSO gas, the oxygen containing gas or the inert gas may be collectively or individually reduced or increased when transitioned from the first gas mixture to the second gas mixture. For example, the flow rate of the HMDSO gas may be dropped about 30 percent to 60 percent from the first deposition gas mixture to the second gas mixture. The oxygen containing gas and the inert gas may be supplied substantially the same or varied in any ratio as needed during the transition.

Other process parameters, such as RF power, gas process, spacing may be kept the same or varied as needed. In one example, the deposition process for forming the interface layer 316 may be performed for between about 30 seconds and about 60 seconds, such as about 40 seconds for a thickness of between about 200 nm and about 500 nm.

In another example, the interface layer 316 may be formed as a gradient film by gradually turning down/off the fluorine containing gas when transition from the first gas mixture to the second gas mixture. Gradual turn-down, instead of a sudden shut-off, of the fluorine containing gas may form a gradient layer as the interface layer 316 that has a good film bridging capability to the underlying buffer layer 314.

When starting to supplying the second gas mixture for forming the interface layer 316, the fluorine-containing gas is then gradually turned down/off after the buffer layer 314 of pp-HMDSO:F film layer has reached to a predetermined thickness. For example, the process parameters for forming the buffer layer 314 may keep steady until the thickness of the buffer layer 314 has reached to its target thickness. Subsequently, the fluorine-containing gas supplied in the first gas mixture may be gradually turned down, commencing the second gas mixture for forming the interface layer 316 with gradually diminished fluorine concentration in the resultant pp-HMDSO film. As such, the interface layer 316 is formed as a gradient film that has the fluorine element concentration gradually fade-out until or prior to the completion of the interface layer deposition process.

It is believed that by forming a gradient film for the interface layer 316, the substantially fluorine-eliminated or fluorine-free interface layer 316 as obtained may assist providing a more well-reacted pp-HMDSO film bonding structure at the interface, so as to eliminate formation of the nucleation HMDSO vapor droplets, so that the likelihood of forming bubbles on the surface of the buffer layer 314 may be eliminated.

In one example, the fluorine containing precursor flow rate per substrate surface area in the second deposition gas mixture changes throughout the deposition of the interface layer 316 by incrementally decreasing from about 0.0025 sccm/mm$^2$ to zero in 0.0005 sccm/mm$^2$ increments every 2-4 seconds. In another example, the flow rate of the fluorine containing precursor may be incrementally reduced at a predetermined time period and is completely turned off at least 5 seconds prior to completion of the deposition of the interface layer 316. By doing so, a top portion of the interface layer 310 only contains HMDSO material without fluorine elements.

Furthermore, in addition to forming the interface layer 316 to eliminate bubble, the utilization of the vapor delivery system (VDS) 151 depicted in FIG. 1 may also efficiently reduce likelihood of forming bubbles on the buffer layer 314. As discussed above, the vapor delivery system (VDS) 151 may assist vaporizing the liquid precursor in vapor phase prior to entering to the processing chamber 100 to as to eliminate likelihood of forming bubbles.

Figure 3E:
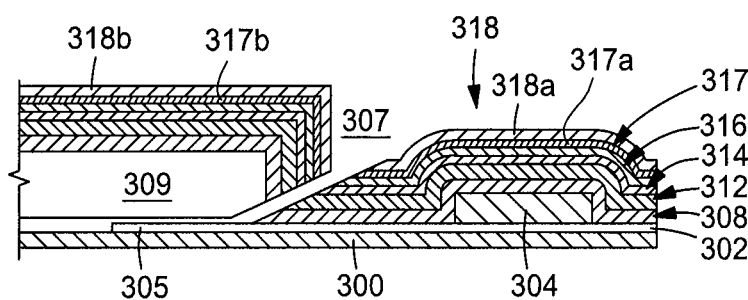

At process 214, after forming the interface layer 316, a second barrier layer 318 may be formed on the interface layer 316, as shown in FIG. 3E. In some examples, an optional stress reduction layer 317 may be formed on the interface layer 316 prior to forming the second barrier layer 318. It is believed that the optional stress reduction layer 317 formed in the film stack may improve light transmission and the film stack transparency. In some situations, poor transmission may be found without utilization of the optional stress reduction layer 317. It is believed that the nature film property of having compressive stress of the second barrier layer 318 may affect the transmission of the light passing therethrough. To promote good optical transmittance (i.e., transmittance of greater than 90 percent), the optional stress reduction layer 317 on the interface layer 316 prior to the second barrier layer 318 as needed. The stress reduction layer 316 may comprise a dielectric material such as silicon oxynitride and be formed by introducing a silicon containing precursor, a nitrogen containing precursor, and oxygen containing precursor and hydrogen. The stress reduction layer 317 will have a slight tensile stress to counteract the compressive stress of the second barrier layer 318. The stress reduction layer 317 includes a first portion 317a deposited over the first portion 314a of the buffer layer 314 and a second portion 317b deposited over the second portion 314b of the buffer layer 314.

In one example, the second barrier layer 318 is formed over the substrate 300, covering the stress reduction layer 317, as shown in FIG. 3E. The second barrier layer 318 includes a first portion 318a deposited over the first portion 317a of the stress reduction layer 317 and a second portion 318b deposited over the second portion 317b of the stress reduction layer 317. The second barrier layer 318 may have a thickness of between about 5000 Angstroms and about 10000 Angstroms.

The second barrier layer 318 may be a dielectric layer similar to the first barrier layer 308. The second barrier layer 318 is a dielectric layer such as SiN, SiON, SiO$_2$, or other suitable dielectric layers. In one embodiment, the second barrier layer 318 comprises silicon nitride. The second barrier layer 318 may be deposited by a suitable deposition technique, such as CVD, PVD, spin-coating, or other suitable technique.

The deposition of the first barrier layer, the buffer adhesion layer, the buffer layer, the interface layer, the stress reduction layer and the second barrier layer as described herein may be performed in a single deposition chamber, such as PECVD processing chamber 100. Purging of the process chamber may be performed between cycles to minimize the risk of contamination. The single chamber process may be advantageous in reducing cycle times as well as reducing the number of chambers (and equipment costs) of using a multiple chamber process. It is noted that first barrier layer, the buffer adhesion layer, the buffer layer, the interface layer, the stress reduction layer and the second barrier layer may be in whole or partially formed in different chambers or in any configurations or any combinations as needed.

In summary, an OLED device is formed with a buffer layer and an interface layer sandwiched between two barrier layers. The buffer layer is fluorine containing HMDSO layer (e.g., HMDSO:F) formed over a first barrier layer with a fluorine-containing plasma while the interface layer formed on the buffer layer may be a fluorine free HMDSO layer or a gradient HMDSO layer with varying or gradually diminished fluorine concentration. A second barrier layer is formed over the interface layer. Although one example depicted here includes a buffer layer and an interface layer sandwiched between two barrier layers, it is noted that single or multiple buffer layers with single or multiple interface layers may be formed between the barrier layers. For example, alternating repeated pairs of buffer layer and interface layer, a composite film stack including a buffer layer, a gradient buffer layer, and interface layer, or a composite film stack including more than one buffer layer and/or more than one interface layer, or film stack with any combinations including additional layers suitable to be inserted between the two barrier layers, may be utilized to form the OLED device with desired encapsulation.

While the foregoing is directed to embodiments of the present disclosure, other and further embodiments of the disclosure may be devised without departing from the basic scope thereof, and the scope thereof is determined by the claims that follow.

The invention claimed is:

1. An OLED device, comprising:
   a first barrier layer disposed on a region of a substrate having an OLED structure disposed thereon;
   a fluorinated buffer layer including a polymer material containing fluorine disposed on the first barrier layer;
   an interface layer including the polymer material on the fluorinated buffer layer, wherein the interface layer has a gradually fade-out fluorine concentration; and
   a second barrier layer disposed on the interface layer.

2. The device of claim 1, wherein the interface layer is a fluorine free hexamethyldisiloxane (pp-HMDSO) layer or a gradient hexamethyldisiloxane (pp-HMDSO) layer with varying fluorine concentration.

3. The device of claim 1, wherein the fluorinated buffer layer comprises fluorinated plasma-polymerized hexamethyldisiloxane (pp-HMDSO:F).

4. The device of claim 1, wherein the first barrier layer is a dielectric layer fabricated from silicon nitride (SiN), silicon oxynitride (SiON), silicon dioxide ($SiO_2$), aluminum oxide ($Al_2O_3$), or aluminum nitride (AlN).

5. The device of claim 1, wherein the second barrier layer is a dielectric layer fabricated from silicon nitride (SiN), silicon oxynitride (SiON), or silicon dioxide ($SiO_2$).

6. The device of claim 1, wherein the fluorinated buffer layer has a fluorine content less than 10 atomic percent.

7. The device of claim 1 further comprising:
a buffer adhesion layer formed between the first barrier layer and the fluorinated buffer layer.

8. The device of claim 7, wherein the buffer adhesion layer is a silicon oxynitride or a silicon nitride layer.

9. The device of claim 1 further comprising:
a stress reduction layer formed between the interface layer and the second barrier layer.

10. The device of claim 9, wherein the stress reduce layer is a silicon oxynitride layer.

11. The device of claim 1, wherein the interface layer has a thickness of about 10 percent of a thickness of the fluorinated buffer layer.

12. The device of claim 1, wherein the polymer material comprises plasma-polymerized hexamethyldisiloxane (pp-HMDSO).

13. An OLED device, comprising:
a first barrier layer disposed on a region of a substrate having an OLED structure disposed thereon;
a fluorinated plasma-polymerized hexamethyldisiloxane (pp-HMDSO:F) material formed on the barrier layer; and
a plasma-polymerized hexamethyldisiloxane (pp-HMDSO) material formed on the fluorinated plasma-polymerized hexamethyldisiloxane (pp-HMDSO:F) material.

14. The device of claim 13 further comprising:
a second barrier layer formed on the plasma-polymerized hexamethyldisiloxane (pp-HMDSO) material.

15. The device of claim 13, the plasma-polymerized hexamethyldisiloxane (pp-HMDSO) material is a fluorine free material.

16. The device of claim 13, wherein the plasma-polymerized hexamethyldisiloxane (pp-HMDSO) material has a gradually fade-out fluorine concentration.

17. The device of claim 13, wherein the fluorinated plasma-polymerized hexamethyldisiloxane (pp-HMDSO:F) material has a fluorine content less than 10 atomic percent.

18. The device of claim 13, wherein the plasma-polymerized hexamethyldisiloxane (pp-HMDSO) material has a thickness of about 10 percent of a thickness of the fluorinated plasma-polymerized hexamethyldisiloxane (pp-HMDSO:F) material.

* * * * *